United States Patent [19]
Gertz et al.

[11] Patent Number: 5,433,110
[45] Date of Patent: Jul. 18, 1995

[54] DETECTOR HAVING SELECTABLE MULTIPLE AXES OF SENSITIVITY

[75] Inventors: Didier Gertz, Valence; Pierre-Stéphane Giroud, Bourg-les-Valence, both of France

[73] Assignee: Sextant Avionique, Meudon-La-Foret Cedex, France

[21] Appl. No.: 141,964

[22] Filed: Oct. 28, 1993

[30] Foreign Application Priority Data

Oct. 29, 1992 [FR] France .................. 92 13339

[51] Int. Cl.⁶ .................. G01P 15/00; G01P 1/00; G01R 33/02; H05K 7/02
[52] U.S. Cl. .................. 73/517 R; 73/510; 174/52.1; 324/247; 324/249
[58] Field of Search ........... 324/174, 207.2, 207.21, 324/247, 249, 251, 252, 260, 262; 73/517 R, 517 A; 174/52.1–52.4

[56] References Cited

U.S. PATENT DOCUMENTS

| | | | |
|---|---|---|---|
| 4,283,679 | 8/1981 | Ito et al. | 324/174 X |
| 4,656,750 | 4/1987 | Pitt et al. | 324/251 X |
| 4,771,240 | 9/1988 | Meyer et al. | 324/252 |
| 4,994,739 | 2/1991 | Honda et al. | 324/207.2 X |

FOREIGN PATENT DOCUMENTS

| | | | |
|---|---|---|---|
| 0502222 | 9/1992 | European Pat. Off. . | |
| 1105767 | 4/1960 | Germany | 324/251 |
| 9113744 | 1/1992 | Germany . | |
| 9202533 | 4/1992 | Germany . | |
| 0067982 | 3/1990 | Japan | 324/251 |
| 0212789 | 8/1990 | Japan | 324/207.21 |
| 2178856 | 2/1987 | United Kingdom . | |
| 87/05402 | 9/1987 | WIPO | 324/165 |
| 9212437 | 7/1992 | WIPO . | |

OTHER PUBLICATIONS

O. Lefort, "A Miniature Low Cost Silicon Micromachined Servo Accelerometer", Symposium Gyro Technology, 1988, Stuttgart, Germany.

*Primary Examiner*—Gerard R. Strecker
*Attorney, Agent, or Firm*—Lowe, Price, LeBlanc & Becker

[57] ABSTRACT

A detector for detecting an oriented physical variable includes, in a casing, an acceleration chip-shaped sensor and a board bearing electronic components. The sensor is mounted on a first surface of an insulating part that includes a second surface fastened to the casing, and a third surface that extends parallel with the plane of the board. Conductive paths extend from the first surface, where they are connected to the sensor, and overlap the third surface, where they are connected to contacts of the board. The sensor can be oriented in a desired direction, with respect to the plane of the board. The various electric connections can be formed by ultrasonic bonding.

16 Claims, 4 Drawing Sheets

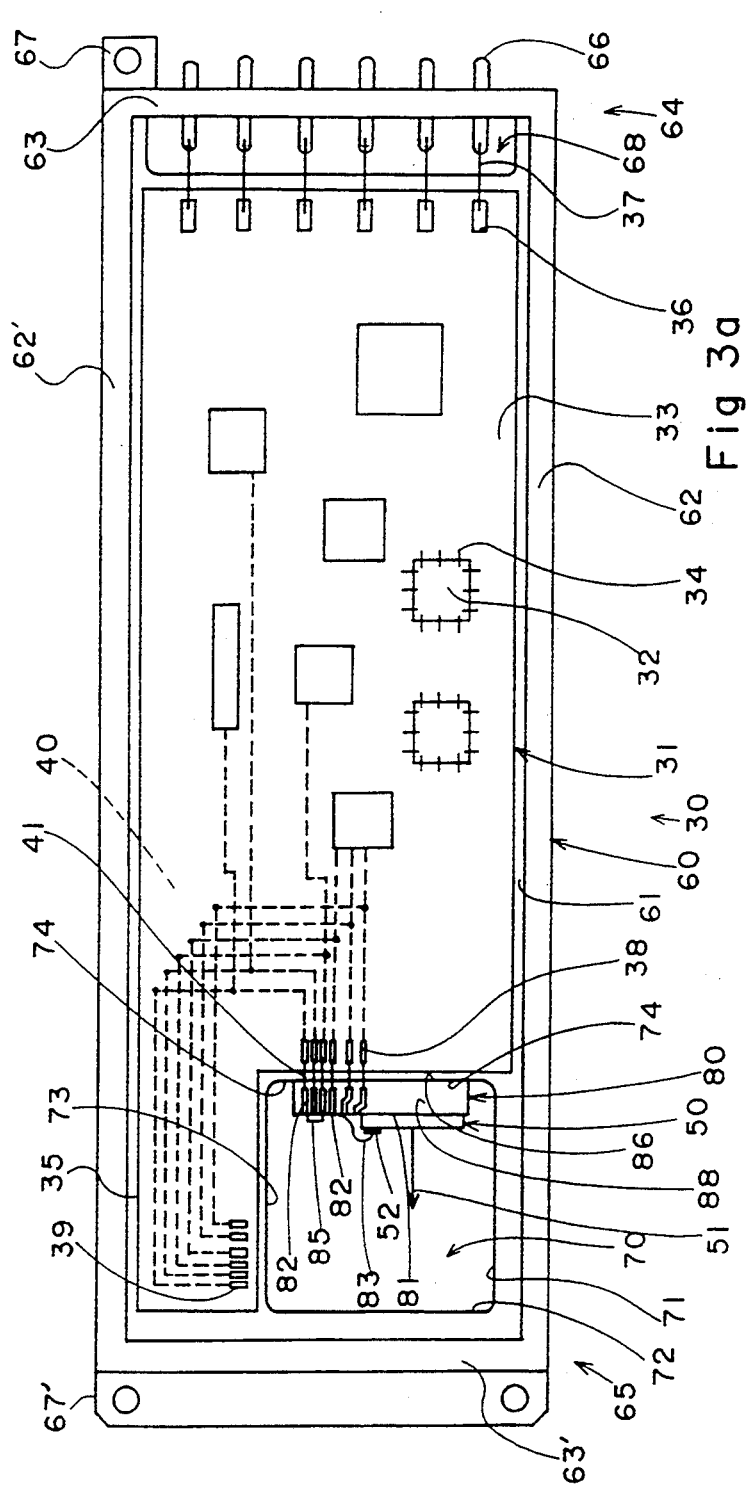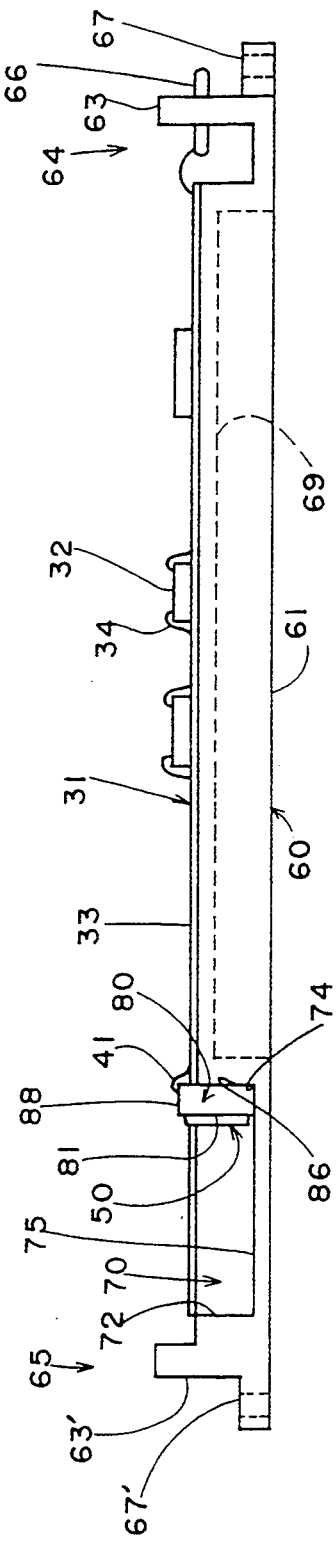

DETECTOR HAVING SELECTABLE MULTIPLE AXES OF SENSITIVITY

BACKGROUND OF THE INVENTION

1. Field of the Invention

The present invention relates to detectors for detecting an oriented physical variable, including a sensor having the shape of a flat chip and sensitive to the physical variable along a predetermined axis, and a board bearing electronic components, that are accommodated in a casing.

It is known that the detection of an oriented physical variable, such as an acceleration or a magnetic field, capable of being represented by a mathematic vector, depends on the measurement of its intensity (module of the vector) and on the determination of its orientation (coordinates of the vector).

2. Discussion of the Related Art

In the field of the detectors of oriented physical variables, recent improvements in etching of crystalline materials have made it possible to fabricate miniaturized chip-shaped sensors, such as, for example, acceleration microsensors or magnetic field microsensors, that advantageously replace the conventional large-size electromechanic or magnetomechanic systems.

However, because of technological constraints, such sensors generally have only a single axis of sensitivity to a physical variable; moreover, the orientation of such axis with respect to the plane of the chip is imposed by the manufacturing technology.

FIG. 1 shows a conventional detector 15 using a miniaturized sensor 1 that can be, for example, an accelerometer or a magnetometer. The chip-shaped sensor 1 is associated with an electronic control circuit 2. The sensor 1 and the electronic circuit 2 are assembled in a single electronic casing 3, represented without a lid to show the various components. The casing 3 includes lateral walls 4, fastening ears 5, and connecting pins 6, for connecting circuit 2 to external components. Circuit 2 has also to be miniaturized and thus can be, for example, a hybrid circuit formed on a ceramic substrate 7 that includes conductive paths 8 for the interconnection of electronic components 9 mounted on substrate 7. The sensor 1 is provided with plated pads 10, connected to metal Lines 8 of the circuit by means of aluminum or gold threads 11, that are welded by ultrasonic bonding.

As indicated above, the sensor 1 is sensitive along a single axis, oriented in a predetermined direction, imposed by the manufacturing technology. In the case of an acceleration sensor, according to the manufacturing technology, the axis of sensitivity 16 can be a transverse axis, perpendicular to the plane of the chip, or a lateral axis 17, parallel to the plane of the chip. In the case of a magnetic field sensor, the axis of sensitivity is generally a transverse axis 16. These various orientations are illustrated in FIG. 1 by axes 16 and 17.

Conventionally, as shown in FIG. 1, sensor 1 is fastened flatwise in casing 3 and disposed in parallel with substrate 7. This positioning is imposed by the ultrasonic bonding technique; such technique requires that the plane of pads 10 be parallel with the plane of metal lines 8 of the substrate. It should be noted that ultrasonic bonding is carried out by means of a tool vibrating at a high frequency (typically 60 KHz) and including a tapered end that abuts against the wiring thread, facing the surface to be welded; the vibration energy transmitted to the thread thus causes, due to friction and heating, welding of the thread. Since the vibrating tool has a fixed orientation, the various points to be connected must be disposed on a same plane, or at least on planes that are substantially parallel. Another equivalent known method consists in mounting the sensor 1 directly on the casing bottom, close to substrate 7.

So, depending on the type of sensor 1 mounted in casing 3, the axis of sensitivity of sensor 15 is therefore oriented perpendicularly to the fixation plane of casing 3, or parallel with this plane, as shown in FIG. 1.

Indeed, the necessity of orienting sensor 1 in a predetermined direction (the direction in which the physical variable is to be measured) may require enlarging casing 3 in a way that raises size problems. This drawback is particularly crucial when the detector is to be mounted in a small-size equipment.

This drawback is also encountered in the case of a system having several axes of detection, for the detection of a physical variable whose orientation and intensity are unknown. To illustrate this last case, FIG. 2 shows a 3-axis accelerometric system 20 fabricated with three accelerometers 15, 15', 15'', each including an acceleration sensor, 1, 1', 1'', having a transverse axis of sensitivity 16, 16', 16''. In this figure, the same reference numerals designate same elements as in FIG. 1. For the fabrication of the 3-axis system 20, the three casings 3, 3', 3'' of accelerometers 15, 15', 15'' had to be mounted on the respective surfaces 22, 23, 24 of a mechanic support 21 forming a reference trihedron. As can be seen, such an arrangement is cumbersome: the length of each casing 3, 3', 3'' being typically approximately 10 centimeters, the volume occupied by the 3-axis system 20 is at least approximately 1 $dm^3$, which is a large volume in an electronic equipment.

SUMMARY OF THE INVENTION

An object of the invention is to avoid the above-mentioned drawbacks.

Another object of the invention is to provide means for orienting the sensor in a predetermined way with respect to the casing while maintaining the possibility of using a technique such as wire bonding.

Another object of the invention is to fabricate a detector including a sensor capable of being oriented.

A further object of the invention is to fabricate a small-size system having several axes of sensitivity.

To achieve these objects, the present invention provides a detector for detecting an oriented physical variable, including a chip-shaped sensor, sensitive to said physical variable according to a predetermined axis, and a board supporting electronic components that are contained in a casing. In such detector:

the chip is mounted on a first surface of an insulating part that includes a second surface fastened to the casing and a third surface extending in a direction parallel with the plane of the board, conductive paths extend from the first surface, where they are connected to contacts of the microwafer, and are prolonged over the third surface, and the board includes contacts disposed so as to face the extensions of the conductive paths on the third surface.

Thus, with the invention, the orientation of the sensor can be selected with respect to the plane of the board, by acting on the relative orientation of the first and third surfaces of the insulating part. A further advantage is that the electric connections between the sensor and the conductive paths on the first surface, as well as the electric connections between the conductive paths on the third surface and the contacts of the board, can be conventionally carried out, more particularly by using ultrasonic wire bonding.

To orientate the sensor, it is also possible to act on the orientation of the insulating part and to provide several locations for fastening the insulating part, since the board includes contacts disposed in the vicinity of each location, in register with the extensions of the conductive paths when the insulating part is mounted on one of these locations. Thus, a modular detector, having a sensor that can be oriented, is achieved, each location corresponding to a given detection orientation.

The insulating part is preferably fastened on a wall of the casing 3, a portion at least of the wall extending below the plane of the board, a portion of the second surface of the insulating part can also extend beyond the wall. This arrangement reduces the vertical size of the insulating part, and therefore decreases the height needed between the plane of the board and the casing lid.

According to an embodiment of the invention, the casing includes several walls, of the above-described type, having various orientations, the board having contacts disposed on the edge of each wall, facing the extensions of the conductive paths when the insulating part is mounted on one of these walls.

In an advantageous embodiment of the invention, the walls are the walls of a cavity extending in an area of the casing; this cavity can be formed by hollowing the bottom plate of the casing.

According to a particularly simple embodiment of the invention, the cavity is parallelepipedic. By choosing an insulating part that is also shaped like a parallelepiped, the first surface, on which the chip is mounted, being parallel with the second surface and fastened to the casing, the sensor can be oriented according to three orthogonal directions. In this case, in order to fasten the insulating part, only two lateral walls of the cavity and the wall forming the cavity bottom are needed.

The insulating part can be made of ceramic and fabricated using co-sintered circuit technology. In this case, it is possible to form conductive paths partially extending inside the insulating part in order to couple the first and the second surface of the part without crossing an edge of the part.

The ceramic insulating part can also be fabricated using thick-film hybrid-circuit technology, the conductive paths being in this case formed through conductive ink serigraphy.

The invention also provides a detector of the type described above, including at least a second sensor for detecting the physical variable.

According to a first embodiment of the invention, the second sensor is mounted by means of a second insulating part that is fastened to one of the above-described locations. Thus, a detector having two, three, or more axes of sensitivity can be formed in a single casing.

According to a second embodiment of the invention, the second sensor is mounted on a fourth surface of the insulating part that includes the first sensor. In this case, conductive paths, extending from this fourth surface up to the third surface, parallel with the board, must be provided.

The foregoing and other objects, features, aspects and advantages of the invention will become apparent from the following detailed description of an accelerometer according to the present invention when taken in conjunction with the accompanying drawings.

BRIEF DESCRIPTION OF DRAWINGS

FIG. 3a is a top view of an accelerometer according to the invention;

FIG. 3b is a longitudinal cross-sectional view of the accelerometer of FIG. 3a;

DETAILED DESCRIPTION

Figure 1:
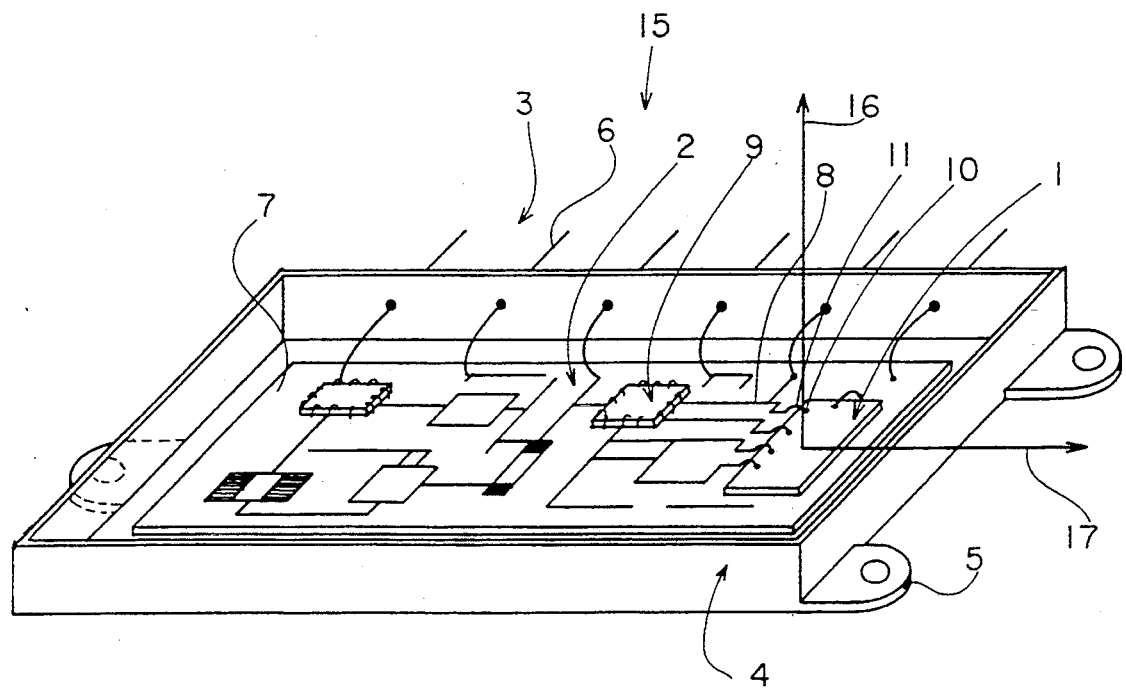
FIGS. 1 and 2, above described, illustrate the state of the art.
Figure 2:
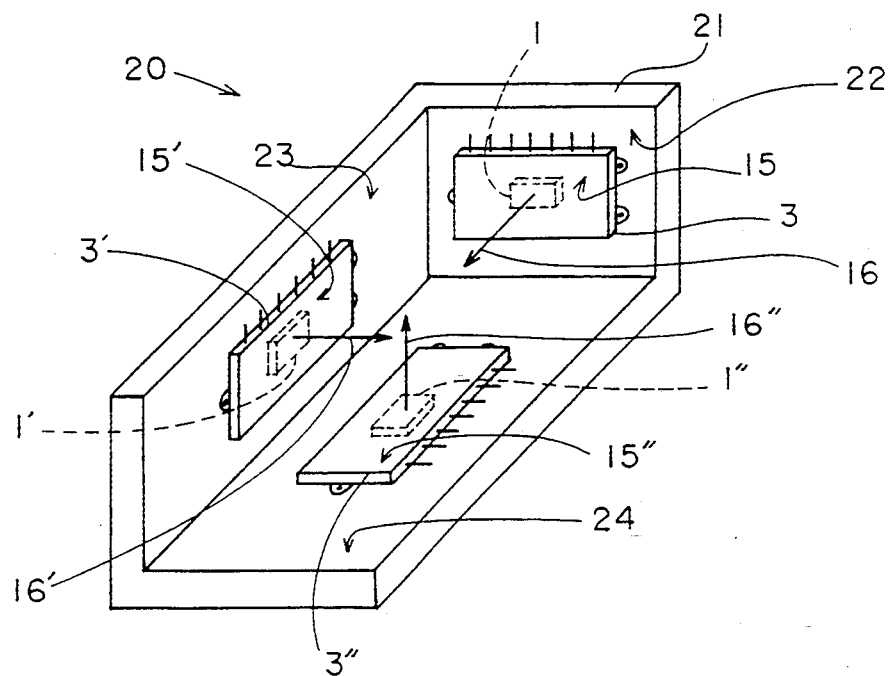

FIGS. 3a and 3b represent an integrated accelerometer according to the invention.

The accelerometer 30 conventionally includes an electronic circuit 31 associated with an accelerometric sensor 50; the assembly of circuit 31 and sensor 50 is disposed in a protection casing 60, that is designed to be fitted with a lid so as to form an airtight chamber.

In this embodiment, the casing 60 is rectangular and includes a thick bottom plate 61, longitudinal lateral walls 62, 62' and transverse walls 63, 63'. At one end 64 of casing 60, connecting pins 66, crossing wall 63, are provided. Fastening ears 67, 67', that are formed at opposite ends 64, 65 of casing 60 by extensions of the bottom plate 61, are for mounting the casing on a support. In a corner of casing 60, in the vicinity of walls 62 and 63', a square cavity 70 is provided in the bottom plate 61. Cavity 70 that is perpendicular to the bottom plate 61 and parallel with the casing edges, has four side walls 71, 72, 73, 74 forming the cavity edges, and a bottom wall 75. Adjacent walls 71, 72, 73, 74 are orthogonal; wall 75 is parallel with the bottom plate 61. At the end 64 of casing 60, a second cavity 68, transverse with respect to the bottom plate 61, allows the passage of the connecting pins 66 into the casing 60. To provide a thinner bottom plate 61, and therefore to reduce the mass of casing 60, a recess 69 can be made in the back of the casing (as shown in dotted lines in FIG. 3b), so that the mean thickness of the bottom plate 61 is similar to the thickness of a conventional casing.

Circuit 31, fastened on the bottom plate 61, is formed by electronic components 32 mounted on an interconnection support 33. Components 32 are mounted and conventionally electrically connected to the interconnection support 33, for example by glueing and thread wiring 34. Circuit 31 can be of any known type, such as a hybrid circuit or a printed circuit. Components 32 can be discrete components or integrated circuits. The interconnection support 33 extends over the whole available surface of the bottom plate 61, from the edge of cavity 68 up to the transverse wall 63' of end 65. It includes for this purpose a narrower extension 35, passing between the wall 73 of cavity 70 and the longitudinal wall 62' of casing 60. Circuit 37 is connected to pins 66 by means of connection threads 37 coupling pins 66 to conductive regions 36 of the interconnection support 33.

Additionally, the interconnection support 33 includes a first row of contacts 38 (six, in the present example), that are disposed along wall 74 of cavity 70, and a second row of six contacts 39, disposed along wall 73 of cavity 70, on the narrower extension 35. Corresponding contacts 38 and 39 are connected to a same potential, as schematically illustrated in FIG. 3a, by electric connections 40 (drawn in dotted lines) leading to various components 32 of circuit 31.

The sensor 50 is a conventional accelerometric cell fabricated by etching a crystalline material such as quartz or silicon, and is formed as a chip provided with plated connecting pads (in the given example, four pads 52). The single-axis sensor 50 has a detection axis 51 perpendicular to its base plane. The structure of sensor 50 and the functionality of the electronic circuit 31, that are part of the technique, will not be described here. The article by O. LEFORT "A Miniature Low Cost Silicon Micromachined Servo Accelerometer", Symposium Gyro Technology, 1988, Stuttgart, Germany, Edition H. Sorg, for example, can be referred to. This article describes various detector structures and the electronic circuits associated therewith.

According to the invention, the sensor 50 is mounted on an insulating part allowing an orientation in a desired way of the sensor 50 inside casing 60, and also a connection of the sensor 50 to the electronic circuit 31 using ultrasonic wire bonding.

In this embodiment, the insulating part is a parallelepipedic and rectangular ceramic part 80 having a thickness of a few millimeters and a surface of a few tens square millimeters. The ceramic part 80 is shown in more detail in FIGS. 4a and 4b, as viewed from the front and rear side, respectively. The ceramic part 80 includes a front surface 81 on which is mounted the sensor 50, and a rear surface 86 that is glued in casing 60, in a way described hereinafter. Conductive paths 82, 82' (here four paths 82 and two paths 82') extend over the front surface 81 and are prolonged over a side surface 88 of part 80, through an edge 87 forming the intersection between the front surface 81 and the side surface 88. On the front surface 81, the conductive paths 82 are arranged so as to face pads 52 of cell 50, and are connected therewith by threads 83 welded by ultrasonic bonding. Paths 82' are similarly connected to pads 90 of an integrated circuit 85 provided for the detection of temperature and mounted in the vicinity of sensor 50. One of the paths 82 is prolonged and progressively enlarged below sensor 50 to form a metallized region 84 for the fastening of sensor 50 when the latter has a conductive rear surface that is to be connected to a voltage source. The rear surface 86 of the ceramic part 80 includes a machined recess 89 embedding the fixing glue of part 80 in order to decrease the parallelism defects due to excessive thickness of glue between the rear surface 88 and its fixation surface.

It can be seen in FIGS. 3a and 3b that the rear surface 86 of the ceramic part 80 is fastened on the wall 74 of cavity 70. However, the rear surface 86 can also be fixed on the wall 73, or on the wall 75 forming the bottom of cavity 70, as will be described later.

The purpose of this arrangement is to provide the possibility of orienting the detection axis 51 of sensor 50 in any of the three following ways:

according to an axis that is longitudinal to casing 60 and parallel with the bottom plate 61, according to an axis that is transverse to and parallel with the bottom plate 61, and perpendicular to the preceding axis, according to a direction perpendicular to the bottom plate 61 (conventional orientation with a transverse-type sensor).

In the accelerometer 30 represented in FIGS. 3a and 3b, the detection axis 51 is oriented in the first way. The ceramic part 80 is glued against the wall 74 of cavity 70 so that the sensor 50 is disposed transversely in casing 60, the detection axis 51 being then oriented longitudinally. When the part 80 is disposed in this way, the side surface 88 is parallel with the interconnection support 33, and paths 82, 82' are disposed so as to coincide with the contacts 38 of circuit 31. Each path 82, 82' can then be coupled to the corresponding contact 38 by wire bonding, an electric connection being then established between circuit 31 and sensor 50.

Therefore, it is clear that the advantage of the system according to the invention is to provide a plane surface (side surface 88), parallel with the interconnection support 33 and on which wiring operations can be carried out, and more particularly ultrasonic bonding.

In FIG. 3b, the ceramic part 80 substantially protrudes from cavity 70. The cavity 70 has, for example, a 4-mm depth, while the ceramic part 80 is 6-mm high, 12-mm long and 2-mm thick. There is therefore a difference of approximately 2 mm between the interconnection support 33 and the side surface 88 of the ceramic part 80 (disregarding the thickness of the support), which does not impair wiring operations.

In addition to the above-described arrangement, and as previously stated, it is also possible, during the mounting of the ceramic part 80, to fix it by its rear surface 86, as follows:

against wall 73, by connecting the ceramic part 80 to contacts 39 of circuit 31; in this case, the sensor 50 is disposed longitudinally in casing 60, the detection axis 51 being oriented in a transverse direction;

against wall 75, that is, horizontally on the bottom of cavity 70, the sensor 50 being then parallel with the bottom plate 61. In such a case, the front surface 81 is parallel with the interconnection support 33 of the circuit; therefore, the ceramic part 80 is connected to the support 33 from its front surface 81. It is also possible to connect the paths 82, 82' of the front surface 81 to contacts 38 of the board (in this case, the side surface 88 is adjacent to the wall 74), or to contacts 39 (in this case, the side surface 88 is adjacent to the wall 73).

Therefore, a modular accelerometer of the invention may be fabricated with several advantageous possibilities for orienting the sensor.

Figure 6:
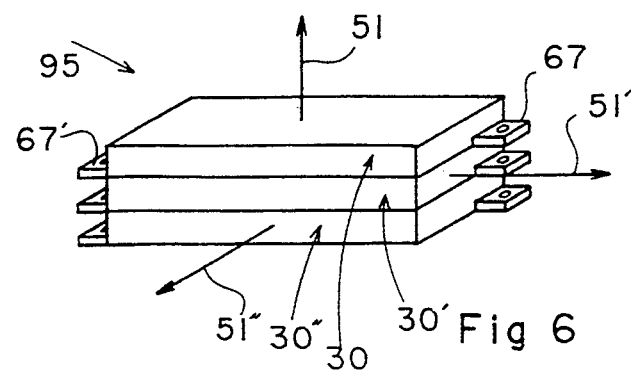
FIG. 6 represents a 3-axis detection system according to the invention.

The invention also solves all the conventional problems associated with the orientation of the casing, which sometimes needed the fabrication of specific supports. Thus, for example, it is possible to easily fabricate a small-size 3-axis detection system 95, such as illustrated in FIG. 6, by piling up three accelerometers 30, 30', 30" having complementary axes of detection 51, 51', 51".

Figure 4A:
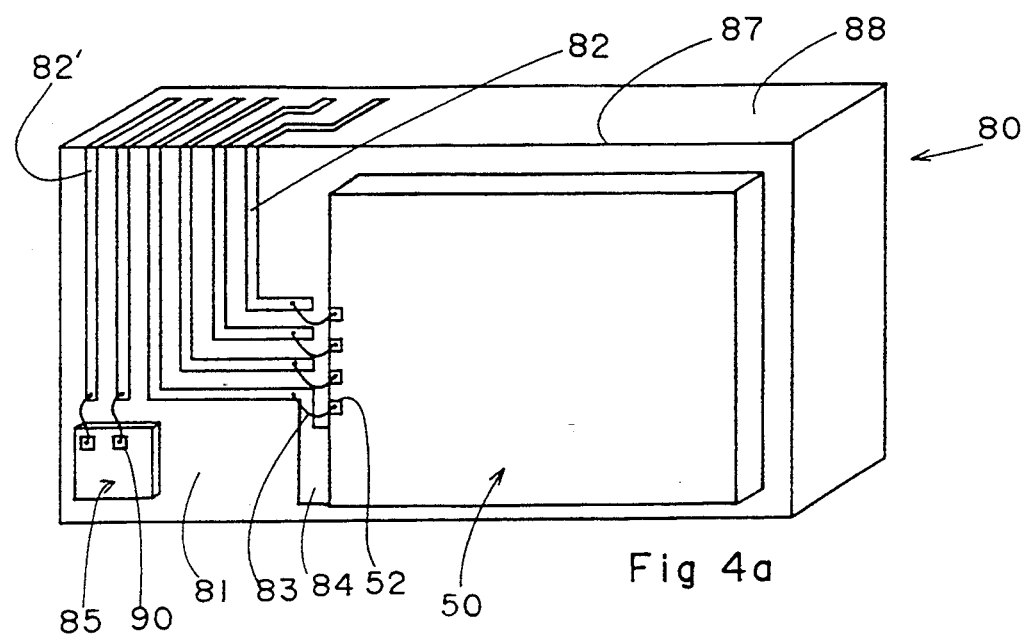
FIGS. 4a, 4b are detailed views of a component of the accelerometer of FIGS. 3a and 3b.
Figure 4B:
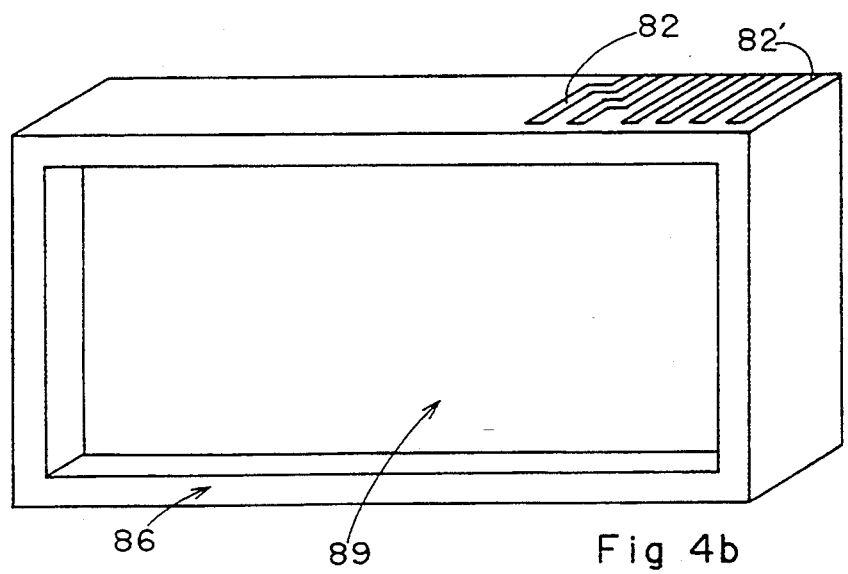

Mow, a technology for fabricating the ceramic part 80 will be described with reference to FIGS. 4a and 4b.

Figure 5:
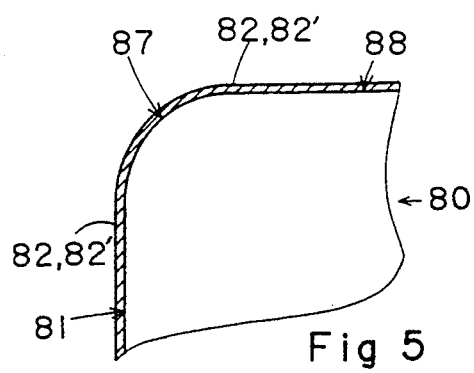
FIG. 5 is a cross-sectional view of a portion of the component of FIGS. 4a and 4b.

The above-described example, the conductive paths 82, 82' are obtained by means of a conventional conductive ink printing technique, that is used for the fabrication of thick-film hybrid circuits. The ink printing of paths 82, 82' is carried out in two steps: in a first step, paths 82, 82' are deposited on the front surface 81; in a second step, paths 82, 82' are deposited on the side surface 88. The ceramic part 80 is obtained by using a standard substrate made of ceramic Al$_2$O$_3$ that is cut off, machined and rectified. The current conduction of paths 82, 82' at the passages of edge 87 can be obtained by manually adding conductive ink, although it is more advantageous to previously blunt edge 87 down to a few tenths of a micron, as illustrated in FIG. 5. In this case, the various portions of paths 82, 82' overlap over edge 87, thus forming a common overlapping area.

It will clearly appear to those skilled in the art that the invention is not limited to this specific technology. It is also possible to use a thin-film technology, a "co-sintered" hybrid circuit technology, a silicon technology. . . .

According to the thin-film technology, paths 82, 82' are obtained by vacuum evaporation of a metal material, such as aluminum, the ceramic part 80 being previously coated with a mechanic or chemical mask (resist).

Figure 7:
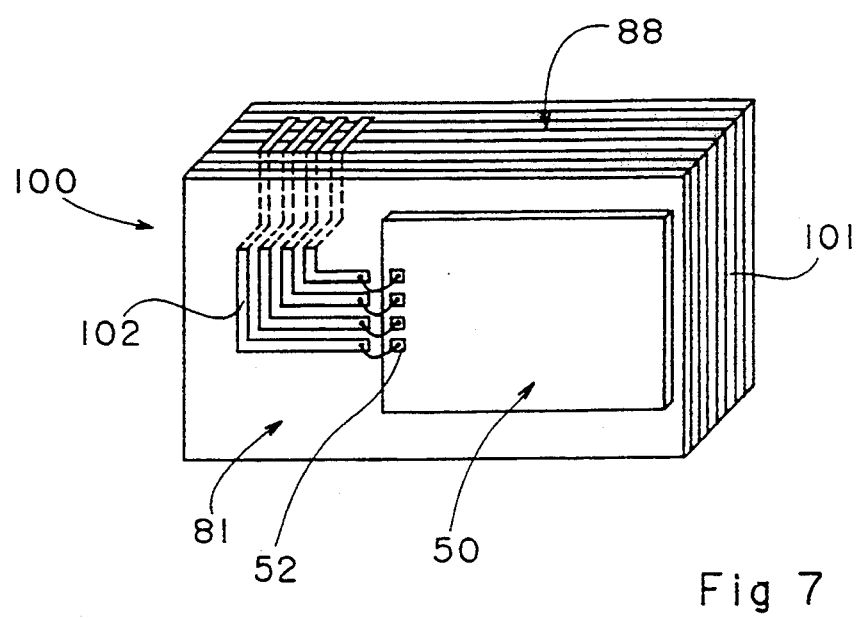
FIG. 7 illustrates an alternative embodiment of the invention.

FIG. 7 shows a schematic view of a ceramic part 100, equivalent to the above-described part 80, and fabricated according to co-sintered circuit technology. The ceramic part 100 is formed by piling up ceramic sheets 101 forming, after a high-temperature treatment, a bulk assembly. Such a technology allows the formation of conductive paths inside the ceramic structure itself. Thus, conductive paths 102, passing inside part 100 (passages are drawn in dotted lines), connect the side surface 88 of part 100 to its front surface 81. In order to connect part 100 from the front surface 81, paths 102 are sufficiently prolonged at the surface of the front surface 81.

As is apparent to those skilled in the art, various modifications can be made to the above disclosed preferred embodiments. It is possible to apply the invention for the fabrication of a 3-axis accelerometer by disposing on the various walls of a single casing three insulating parts, each supporting a sensor. Those skilled in the art will be capable of adapting the shape and size of the walls, and the disposition of the walls with respect to the circuit, for the mounting and connection of the three sensors. Additionally, the insulating part can be used to support several sensors and can have more or less complex shapes to meet specific requirements.

Last, the invention can be applied to any type of detector including a miniaturized chip-shaped sensor, sensitive to a physical variable according to a predetermined axis.

We claim:

1. A detector for detecting an oriented physical variable, including:
    a casing having a plurality of first walls for defining a first cavity, and a plurality of second walls associated with one of said first walls for holding an oriented member;
    a board mounted within said first cavity for bearing a plurality of electronic components and a plurality of electrical contacts, said board defining a plane,
    an insulating part including first surface, a second surface and a third surface, said first and said third surfaces including a plurality of conductive paths, said conductive paths of said first surface being electrically connected to said conductive paths of said third surface,
    a chip-shaped sensor, mounted on said first surface of said insulating part, for sensing said physical variable along a predetermined axis, said sensor being electrically connected to at least one of said conductive paths on said first surface, said sensor and said insulating part forming said oriented member,
    wherein said second surface of said insulating part is fastened to one of said second walls of said casing, so that said third surface extends in parallel with the plane of said board and at least some of the contacts on the board face extensions of said conductive paths on said third surface.

2. The detector of claim 1, wherein said second walls define a plurality of locations for fastening the insulating part, the board including contacts that are disposed in the vicinity of each fastening location facing extensions of said conductive paths when the insulating part is mounted on one of said fastening locations.

3. The detector of claim 1, wherein, a portion of said one second wall to which the insulating part is fastened extends below the plane of the board, and a portion of said second surface of the insulating part extends beyond said second wall.

4. The detector of claim 3, wherein said casing includes a plurality of differently oriented second walls, the board including contacts disposed on the edge of at least two second walls facing extensions of the conductive paths when the insulating part is mounted on one of said walls.

5. The detector of claim 4, wherein said second walls form a second cavity extending into a portion of said casing.

6. The detector of claim 5, wherein said second cavity is a recess made in a bottom first wall of the casing.

7. The detector of claim 5, wherein said recess is parallelepipedic.

8. The detector of claim 3, wherein the insulating part is parallelepipedic, said first surface, on which the chip is mounted, being chosen to be parallel with said second surface that is fastened to said casing.

9. The detector of claim 1, including at least a second sensor mounted on an insulating part for detecting said physical variable.

10. The detector of claim 9, wherein the second sensor is mounted on a fourth surface of said insulating part that supports the first recited chip-shaped sensor, the fourth surface including conductive paths extending up to said third surface.

11. The detector of claim 9, wherein said second sensor is mounted on a second insulating part.

12. The detector of claim 1, wherein said insulating part is made of ceramic.

13. The detector of claim 12, wherein said insulating part is fabricated according to co-sintered circuit technology, said conductive paths partially extending inside said insulating part.

14. The detector of claim 12, wherein said insulating part is fabricated according to thick-film technology, the conductive paths being carried out by conductive ink serigraphy.

15. The detector of claim 1, wherein the sensor is an acceleration detector.

16. The detector of claim 1, wherein the sensor is a magnetic field detector.

* * * * *